(12) United States Patent
Huang et al.

(10) Patent No.: US 11,882,731 B2
(45) Date of Patent: Jan. 23, 2024

(54) DISPLAY DEVICE, DISPLAY PANEL AND MANUFACTURING METHOD THEREOF

(71) Applicant: BOE TECHNOLOGY GROUP CO., LTD., Beijing (CN)

(72) Inventors: Kuanta Huang, Beijing (CN); Hui Tong, Beijing (CN); Xiong Yuan, Beijing (CN); Xiaobin Shen, Beijing (CN); Yu Wang, Beijing (CN); Qing Wang, Beijing (CN); Shipeng Li, Beijing (CN); Chao Yang, Beijing (CN); Shangquan Shi, Beijing (CN); Yongfa Dong, Beijing (CN); Dongsheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 568 days.

(21) Appl. No.: 17/264,446

(22) PCT Filed: Apr. 21, 2020

(86) PCT No.: PCT/CN2020/085955
§ 371 (c)(1),
(2) Date: Jan. 29, 2021

(87) PCT Pub. No.: WO2021/212333
PCT Pub. Date: Oct. 28, 2021

(65) Prior Publication Data
US 2022/0115469 A1 Apr. 14, 2022

(51) Int. Cl.
*H10K 59/122* (2023.01)
*H10K 50/844* (2023.01)
(Continued)

(52) U.S. Cl.
CPC ........ *H10K 59/122* (2023.02); *H10K 50/844* (2023.02); *H10K 59/80521* (2023.02); *H10K 71/00* (2023.02)

(58) Field of Classification Search
CPC .......... H10K 59/80521; H10K 59/124; H10K 59/122; H10K 50/844; H10K 59/38;
(Continued)

(56) References Cited

U.S. PATENT DOCUMENTS

| 8,816,339 B2 | 8/2014 | Kawamura et al. |
| 9,324,947 B2 | 4/2016 | Sato et al. |

(Continued)

FOREIGN PATENT DOCUMENTS

| CN | 102405686 A | 4/2012 |
| CN | 103137652 A | 6/2013 |

(Continued)

OTHER PUBLICATIONS

International Search Report and Written Opinion for International Application No. PCT/CN2021/088701 dated Aug. 2, 2021.

(Continued)

*Primary Examiner* — Mouloucoulaye Inoussa
(74) *Attorney, Agent, or Firm* — Perilla Knox & Hildebrandt LLP; Kenneth A. Knox

(57) ABSTRACT

A display panel includes a substrate, a planarization layer disposed at a side of the substrate being provided with partitioning slots to form driving areas in an array; a first electrode layer on the planarization layer having first electrodes; wherein orthographic projections of the first electrodes on the planarization layer are within the driving areas; each of the first electrodes includes a planar center portion and an edge portion, the edge portion includes a planarization portion surrounding the center portion and a slope portion connected between the center portion and the pla- (Continued)

narization portion; a pixel definition layer on the planarization layer that exposes part of the center portion; a light-emitting functional layer covering the pixel definition layer, the center portion being exposed by the pixel definition layer and the planarization layer and a second electrode covering the light-emitting functional layer.

20 Claims, 8 Drawing Sheets

(51) Int. Cl.
*H10K 71/00* (2023.01)
*H10K 59/80* (2023.01)
(58) Field of Classification Search
CPC ............ H10K 71/233; H10K 59/1201; H10K 50/822; H10K 59/1213; H10K 59/1216; H10K 50/8428; H10K 71/221; H10K 50/824; H10K 50/816; H10K 59/32; H10K 50/813; H10K 50/858; H10K 71/135; H10K 10/84; H10K 59/1315; H10K 59/131; H10K 50/11; H10K 59/80516; H10K 59/80517; H10K 59/80523; H10K 59/873; H10K 71/40; H10K 50/115; H10K 2102/3026; H10K 2102/103; H10K 2102/351; G02B 27/0172; H01L 27/14636; H01L 29/78633; H01L 29/7869; G02F 1/13439
USPC ..... 257/40, 762, E33.062; 138/4, 26, 23, 34
See application file for complete search history.

(56) References Cited

U.S. PATENT DOCUMENTS

| | | | |
|---|---|---|---|
| 9,515,132 B2 | 12/2016 | Sato et al. | |
| 9,666,650 B2 | 5/2017 | Zhang | |
| 10,446,633 B2 | 10/2019 | Liu et al. | |
| 10,504,976 B2 | 12/2019 | Hanashima et al. | |
| 2012/0049175 A1* | 3/2012 | Ono | H10K 59/122 438/34 |
| 2012/0208311 A1* | 8/2012 | Bang | H10K 50/824 438/34 |
| 2012/0228603 A1* | 9/2012 | Nakamura | H10K 50/828 257/40 |
| 2013/0069085 A1* | 3/2013 | Kang | H10K 50/8426 438/23 |
| 2013/0099221 A1 | 4/2013 | Kawamura et al. | |
| 2014/0353599 A1* | 12/2014 | Kang | H10K 59/1213 438/34 |
| 2015/0014636 A1* | 1/2015 | Kang | H10K 50/8428 438/26 |
| 2015/0069361 A1 | 3/2015 | Sato et al. | |
| 2015/0179719 A1* | 6/2015 | Nam | H10K 59/122 438/4 |
| 2016/0013438 A1* | 1/2016 | Im | H10K 59/1315 257/762 |
| 2016/0079325 A1* | 3/2016 | Lee | H10K 59/122 438/26 |
| 2016/0190508 A1* | 6/2016 | Nakamura | H10K 50/824 257/40 |
| 2016/0204187 A1 | 7/2016 | Sato et al. | |
| 2016/0260787 A1* | 9/2016 | Kim | H10K 59/121 |
| 2016/0284774 A1 | 9/2016 | Zhang | |
| 2016/0322437 A1 | 11/2016 | Sakamoto et al. | |
| 2017/0005286 A1* | 1/2017 | Yun | H10K 59/35 |
| 2017/0317154 A1* | 11/2017 | Heo | H10K 59/1315 |
| 2018/0120620 A1* | 5/2018 | Shim | H10K 59/122 |
| 2018/0123081 A1* | 5/2018 | Baik | H10K 59/122 |
| 2018/0190737 A1* | 7/2018 | Yang | H10K 71/00 |
| 2019/0006443 A1 | 1/2019 | Hanashima et al. | |
| 2019/0006557 A1* | 1/2019 | Kim | H01L 33/20 |
| 2019/0115403 A1* | 4/2019 | Kang | H10K 50/84 |
| 2019/0123121 A1 | 4/2019 | Liu et al. | |
| 2020/0043998 A1* | 2/2020 | Choi | H10K 50/8445 |
| 2020/0152717 A1* | 5/2020 | Hwang | H10K 71/40 |
| 2020/0212146 A1* | 7/2020 | Shin | H10K 59/121 |
| 2020/0251541 A1* | 8/2020 | Kim | H10K 71/00 |
| 2020/0279896 A1* | 9/2020 | Cao | H10K 59/173 |
| 2021/0091158 A1* | 3/2021 | Kasahara | H05B 33/26 |

FOREIGN PATENT DOCUMENTS

| | | |
|---|---|---|
| CN | 103311265 A | 9/2013 |
| CN | 103887261 A | 6/2014 |
| CN | 104517997 A | 4/2015 |
| CN | 103311265 B | 5/2016 |
| CN | 107808895 A | 3/2018 |
| CN | 109216413 A | 1/2019 |
| CN | 110808340 A | 2/2020 |
| CN | 212342660 U | 1/2021 |
| CN | 113451524 A | 9/2021 |
| JP | 2011044271 A | 3/2011 |
| JP | 2011249089 A | 12/2011 |
| JP | 2019012684 A | 1/2019 |
| WO | 2012017498 A1 | 2/2012 |

OTHER PUBLICATIONS

Written Opinion for International Application No. PCT/CN2020/085955 dated Jan. 27, 2021.
Kohei Yokoyama et al, "Ultra-High-Resolution 1058-ppi OLED Displays with 2.78-in Size using CAAC-IGZO FETs with Tandem OLED Device and Single OLED Device," Journal of the Society for Information Display (SID) (Alleged Publication: Mar. 2016).
First Office Action for CN Patent Application No. 2020800005649 dated Sep. 15, 2022.

* cited by examiner

US 11,882,731 B2

DISPLAY DEVICE, DISPLAY PANEL AND MANUFACTURING METHOD THEREOF

CROSS-REFERENCE TO RELATED APPLICATION

The present disclosure is a 35 U.S.C. § 371 national phase application of, and claims the benefit of and priority to, International Application No. PCT/CN2020/085955, filed on Apr. 21, 2020, the contents of which being incorporated by reference in their entirety herein.

TECHNICAL FIELD

This disclosure relates to the field of display technology and, in particular, to a display device, a display panel, and a manufacturing method of the display panel.

BACKGROUND

Currently, organic light-emitting diode (OLED) display panels are more and more widely used. In an OLED display panel, the light-emitting device usually includes a plurality of OLED light-emitting devices in an array, and each of the light emitting devices may emit light independently in order to display images. However, due to the manufacturing process, light-emitting stability of OLED light-emitting devices still needs to be improved.

It should be noted that information disclosed in this part are provided only for acquiring a better understanding of the background of the present application and therefore may include information that is not current technology already known to those of ordinary skilled in the art.

SUMMARY

According to one aspect of the present disclosure, a display panel includes:
a substrate;
a planarization layer at a side of the substrate, and a surface of the planarization layer away from the substrate being provided with a plurality of partitioning slots to form a plurality of driving areas in an array;
a first electrode layer on the surface of the planarization layer away from the substrate, and including a plurality of first electrodes; orthographic projections of the first electrodes on the planarization layer being located within the driving areas in one-to-one correspondence; each of the first electrodes including a planar center portion and an edge portion surrounding the center portion; the edge portion including a planarization portion surrounding the center portion and a slope portion connected between the center portion and the planarization portion; and a thickness of the planarization portion being smaller than a thickness of the center portion;
a pixel definition layer on the surface of the planarization layer away from the substrate, and exposing at least part of an area of the center portion;
a light-emitting functional layer covering the pixel definition layer, the center portion exposed by the pixel definition layer and the planarization layer;
a second electrode covering the light-emitting functional layer.

In one exemplary embodiment of the present disclosure, a maximum depth of the partitioning slot is not less than 30% of a sum of thicknesses of the light-emitting functional layer and the first electrodes.

In one exemplary embodiment of the present disclosure, a maximum depth of the partitioning slot is not less than 60% of a sum of thicknesses of the light-emitting functional layer and the first electrodes.

In one exemplary embodiment of the present disclosure, the maximum depth of the partitioning slot is 1000-3000 Å.

In one exemplary embodiment of the present disclosure, the partitioning slot comprises two opposite side walls and a bottom surface connected between two said side walls, and a maximum distance between two said side walls is 0.2 μm-0.7 μm.

In one exemplary embodiment of the present disclosure, the partitioning slot comprises two opposite side walls and a bottom surface connected between two said side walls, and the bottom surface is a curved surface projected to a direction away from the substrate.

In one exemplary embodiment of the present disclosure, the partitioning slot comprises two opposite side walls and a bottom surface connected between two said side walls, and two said side walls are in parallel.

In one exemplary embodiment of the present disclosure, the partitioning slot comprises two opposite side walls and a bottom surface connected between two said side walls; and a distance between two said side walls decreases in a direction close to the bottom surface.

In one exemplary embodiment of the present disclosure, slopes of two said side walls are not less than 70°, and the slopes are included angles between the side walls and the surface of the planarization layer away from the substrate.

In one exemplary embodiment of the present disclosure, a distance between a boundary of an orthographic projection of the center portion on the substrate and a boundary of a projection of a driving area where the center portion positions on the substrate is not less than 0.15 μm.

In one exemplary embodiment of the present disclosure, a distance between a boundary of an orthographic projection of the planarization portion on the substrate and a boundary of an orthographic projection of the driving area where it is in on the substrate is not less than 0.

In one exemplary embodiment of the present disclosure, the pixel definition layer extends into the partitioning slot and is recessed in an area corresponding to the partitioning slot.

According to one exemplary embodiment of the present disclosure, it is provided with a display panel, including:
a substrate;
a planarization layer at a side of the substrate;
a first electrode layer on a surface of the planarization layer away from the substrate and including a plurality of first electrodes; each of the first electrodes including a planar center portion and an edge portion surrounding the center portion; the edge portion including a planarization portion surrounding the center portion and a slope portion connected between the center portion and the planarization portion, and a thickness of the planarization portion being smaller than that of the center portion;
a light-emitting functional layer covering at least part of an area of the center portion;
a second electrode covering the light-emitting functional layer and including a recessed portion and a plurality of flat portions separated by the recessed portion; orthographic projections of the flat portions on the planarization layer being located within the first electrodes in one-to-one correspondence; the recessed portion being recessed toward a side of each of the flat portions close to the substrate; and an orthographic projection of the recessed portion on the planarization layer being at least partially located outside the center portion.

In one exemplary embodiment of the present disclosure, on a section perpendicular to the substrate, an orthographic projection of a lowest point of the recessed portion on the planarization layer is located outside the center portion.

In one exemplary embodiment of the present disclosure, the recessed portion comprises a first side surface, a second side surface and a bottom surface; the first side surface and the second side surface are oppositely connected to two sides of the bottom surface, and the first side surface and the second side surface contract in a direction close to the substrate.

In one exemplary embodiment of the present disclosure, the bottom surface of the recessed portion comprises a first slope surface, a second slope surface and a connecting surface connected between the first slope surface and the second slope surface; the connecting surface is located at a side of bottom ends of the first side surface and the second side surface away from the substrate; and the first slope surface is connected to the bottom end of the first side surface, and the second slope surface is connected to the bottom end of the second side surface.

In one exemplary embodiment of the present disclosure, a slope of the first slope surface relative to the center portion is not smaller than a slope of the first side surface relative to the center portion;
a slope of the second slope surface relative to the center portion is not smaller than a slope of the second side surface relative to the center portion.

In one exemplary embodiment of the present disclosure, in a section perpendicular to the substrate, the first slope surface and the second slope surface are symmetrical to the connecting surface, and the first side surface and the second side surface are symmetrical to the bottom surface.

In one exemplary embodiment of the present disclosure, a minimum thickness of an area of the first side surface and the second side surface corresponding to the second electrode is greater than a minimum thickness of an area corresponding to the first slope surface and the second slope surface.

In one exemplary embodiment of the present disclosure, the surface of the planarization layer away from the substrate is provided with a plurality of partitioning slots, to form a plurality of driving areas in an array; and orthographic projections of the first electrodes on the planarization layer are located within the first electrodes in one-to-one correspondence;
the display panel further comprises:
a pixel definition layer on the surface of the planarization layer away from the substrate, and exposing at least part of an area of the center portion; and at least part of an area of the orthographic projection of the recessed portion on the planarization layer is located within the partitioning slot.

In one exemplary embodiment of the present disclosure, the display panel further comprises:
a first encapsulation layer covering the second electrode and forming a dent in an area corresponding to the recessed portion.

In one exemplary embodiment of the present disclosure, two side walls of the dent are narrowed to a direction close to the substrate and connected.

According to one aspect of the present disclosure, it is provided with a manufacturing method of a display panel, including:
forming a planarization layer at a side of a substrate;

forming a plurality of partitioning slots on a surface of the planarization layer away from the substrate, to form a plurality of driving areas in an array;
forming a first electrode layer including a plurality of first electrodes on the surface of the planarization layer away from the substrate, in which orthographic projections of the first electrodes on the planarization layer are located within the driving areas in one-to-one correspondence; each of the first electrodes comprises a planar center portion and an edge portion surrounding the center portion; the edge portion comprises a planarization portion surrounding the center portion and a slope portion connected between the center portion and the planarization portion; and a thickness of the planarization portion is smaller than that of the center portion;
forming a pixel definition layer on a surface of the planarization layer away from the substrate, and the pixel definition layer exposing at least part of an area of the center portion;
forming a light-emitting functional layer that covers the pixel definition layer, the center portion exposed by the pixel definition layer and the planarization layer;
forming a second electrode that covers the light-emitting functional layer.

According to one aspect of the present disclose, it is provided with a manufacturing method of a display panel, including:
forming a planarization layer at a side of a substrate;
forming a first electrode layer including a plurality of first electrodes and a partitioning layer on a surface of the planarization layer away from the substrate, in which each of the first electrodes comprises a planar center portion and an edge portion surrounding the center portion; the edge portion comprises a planarization portion surrounding the center portion and a slope portion connected between the center portion and the planarization portion; and a thickness of the planarization portion is smaller than that of the center portion; the partitioning slot divides a plurality of driving areas in an array on the planarization layer; orthographic projections of the first electrodes on the planarization layer are located within the driving areas in one-to-one correspondence;
forming a pixel definition layer on the surface of the planarization layer away from the substrate, and the pixel definition layer exposing at least part of an area of the center portion;
forming a light-emitting functional layer that covers the pixel definition layer, the center portion exposed by the pixel definition layer and the planarization layer;
forming a second electrode that covers the light-emitting functional layer.

According to one aspect of the present disclosure, it is provided with a manufacturing method of a display panel, including:
forming a planarization layer at a side of a substrate;
forming a first electrode layer including a plurality of first electrodes on a surface of the planarization layer away from the substrate, in which each of the first electrodes comprises a planar center portion and an edge portion surrounding the center portion; the edge portion comprises a planarization portion surrounding the center portion and a slope portion connected between the center portion and the planarization portion; and a thickness of the planarization portion is smaller than that of the center portion;

forming a light-emitting functional layer that covers at least part of an area of the center portion;

forming a second electrode that covers the light-emitting functional layer, in which the second electrode comprises a recessed portion and a plurality of flat portions separated by the recessed portion; orthographic projections of the flat portions on the planarization layer are located within the first electrodes in one-to-one correspondence; the recessed portion is recessed toward a side of each of the flat portions close to the substrate; and an orthographic projection of the recessed portion on the planarization layer is at least partially located outside the center portion.

According to one aspect of the present disclosure, it is provided with a display device including the display panel according to any one of the above-mentioned embodiments.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the present disclosure and together with the description, serve to explain the principles of the present disclosure. It should be apparent that the drawings in the following description are merely examples of this disclosure, and that other drawings may be obtained by those ordinary skilled in the art without creative work.

DETAILED DESCRIPTION

Figure 1:
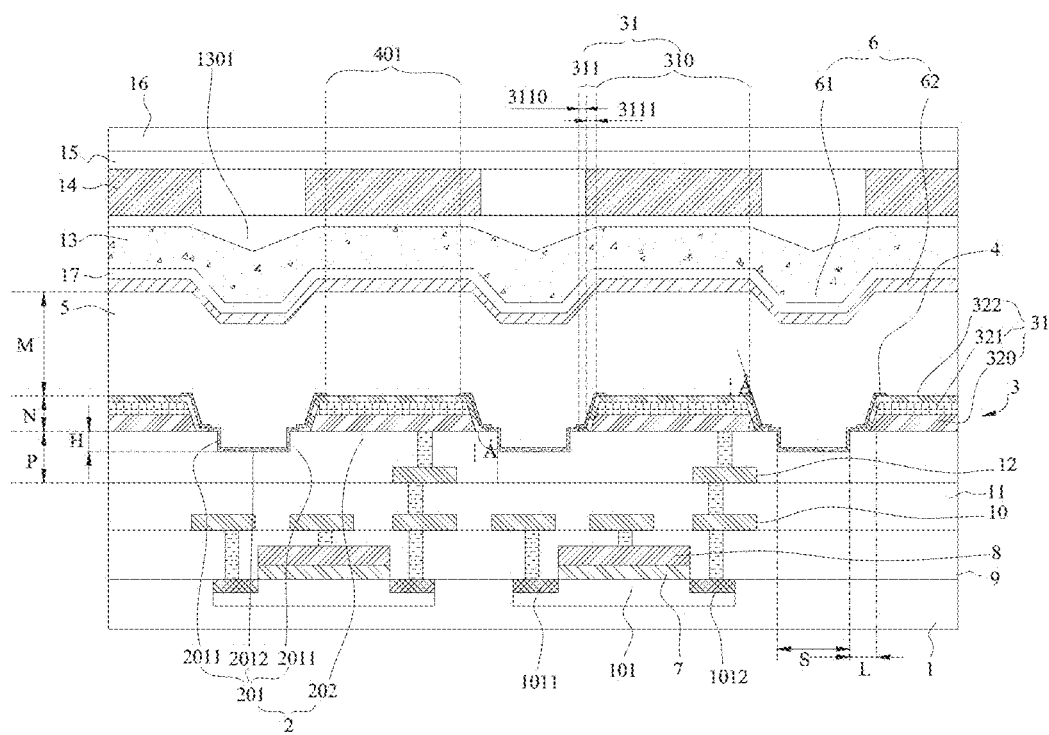
FIG. 1 is a schematic view of an embodiment of a first type display panel of the present disclosure.

Exemplary embodiments will now be described more fully by reference to the accompanying drawings. However, the exemplary embodiments can be implemented in various forms and should not be understood as being limited to the examples set forth herein; rather, the embodiments are provided so that this disclosure will be thorough and complete, and the conception of exemplary embodiments will be fully conveyed to those skilled in the art. The same reference signs in the drawings denote the same or similar structures and detailed description thereof will be omitted. In addition, the drawings are merely schematic illustrations of the present disclosure and are not necessarily drawn to scale.

Although relative terms such as "above" and "under" are used herein to describe the relationship of one component relative to another component, such terms are used herein only for the sake of convenience, for example, in the direction shown in the figure, it should be understood that if the referenced device is inversed upside down, a component described as "above" will become a component described as "under". When a structure is described as "above" another structure, it probably means that the structure is integrally formed on another structure, or, the structure is "directly" disposed on another structure, or the structure is "indirectly" disposed on another structure through an additional structure.

Words such as "one", "an/a", "the" and "said" are used herein to indicate the presence of one or more elements/component parts/and others. Terms "including", and "having" have an inclusive meaning which means that there may be additional elements/component parts/and others in addition to the listed elements/component parts/and others. Terms "first", "second", "third" and "fourth" are used herein only as markers, and they do not limit the number of objects modified after them.

In the related art, an OLED display panel includes a driving backplane, a plurality of first electrodes, a pixel definition layer, a light-emitting functional layer, a second electrode and a color film layer, wherein the first electrode array is distributed on the driving backplane; the pixel definition layer is provided on a surface of the driving backplane provided with the first electrodes, and exposes the first electrodes; the light-emitting functional layer covers the pixel definition layer and the surfaces of the first electrodes away from the driving backplane, and the second electrode covers a surface of the light-emitting functional layer away from the driving backplane, so that a plurality of light-emitting devices may be defined by the pixel definition layer. Driven by a driving signal, holes injected by the first electrodes and electrons injected by the second electrodes enter the light-emitting functional layer, and form excitons, and radiation of the excitons transitions to emit photons so as to form electroluminescence. A color filter layer is arranged at a side of the second electrode away from the driving backplane, and has a plurality of filter areas corresponding to the light-emitting device in one-to-one correspondence, and each filter area and its corresponding light-emitting device may be used as a sub-pixel.

Since the thickness of the pixel definition layer is greater than that of the first electrode, when the light-emitting functional layer is formed by an evaporation process, the light-emitting functional layer appears a recess at a junction of the first electrode and the pixel-definition layer, that is, at an edge of the light-emitting device, so that the second correspondingly form a recessed area. The recessed area of the second electrode is relatively close to the electrode, which is prone to cause a tip discharge or even short circuit, to affect the stability of the light-emitting device, so that it is difficult for the display panel to emit light stably. At the same time, the recessed area of the second electrode corresponds to the first electrode, so that light can be emitted. However, since an appearance of the recessed area is a structure recessed toward the drive backplane, rather than a planar structure, the light emitted within the recessed area is in a scattering state, and at least part of the light is skewed toward adjacent sub-pixels, and the light emission of adjacent sub-pixels interferes with each other, so as to affect the display effect.

The light-emitting functional layer is recessed at the junction of the first electrode and the pixel definition layer, so that the second electrode forms a recessed area in an area corresponding to the recess. The recessed area is directly opposite to the first electrode, that is, an orthographic projection of the recessed area on the drive backplane is located with the first electrode, so that a sharp discharge or even a short circuit may occur between the first electrode and the second electrode. At the same time, the recessed area emits light, and since the shape of the recessed area is curved shape, the light emitted by the recessed area is in a scattered state, so as to interfere the light emission of adjacent sub-pixels.

In addition, since the light-emitting functional layer is an entirely continuous film layer, the sub-pixels are connected to each other. At least a part of the film layer (include but not limited to a hole injection layer) in the light-emitting functional layer can produce crosstalk between the adjacent ones of the sub-pixels. In particular, for a serial OLED display panel, the light-emitting functional layer includes a plurality of light-emitting unit layers, and two adjacent ones of the light-emitting unit layers are connected in series through a charge generation layer. However, the charge generation layer has good charge conduction characteristics, to produce crosstalk between the adjacent ones of the sub-pixels and affect the light-emitting effect.

In order to solve at least one of the technical problems in the above-mentioned related art, embodiments of the present disclosure provide two types of display panels.

The reference numbers used in the drawings are listed as follows: 1. substrate; 101. active area; 1011. source electrode; 1012. drain electrode; 2. planarization layer; 201. partitioning slot; 2011. side wall; 2012. bottom wall; 202. driving area; 3. first electrode layer; 31. first electrode; 310. center portion; 311. edge portion; 3110. planarization portion; 3111. slope portion 3111; 320. first conductive layer; 321. second conductive layer; 322. third conductive layer, 4. pixel definition layer; 401. opening; 5. light-emitting functional layer; 501. light-emitting unit layer; 502. charge generation layer; 6. second electrode; 61. recessed portion; 611. first side surface; 612. second side surface; 613. bottom surface; 6131. first slope surface; 6132. second slope surface; 6133. connecting surface; 62. flat portion; 7. gate insulating layer; 8. gate electrode; 9. first insulating layer; 10. first wiring layer 11. second insulating layer; 12. second wiring layer; 13. first encapsulation layer; 1301. dent; 14. color film layer; 15. second encapsulation layer; 16. transparent cover plate; 17. light extraction layer.

A First Type Display Panel

Figure 2:
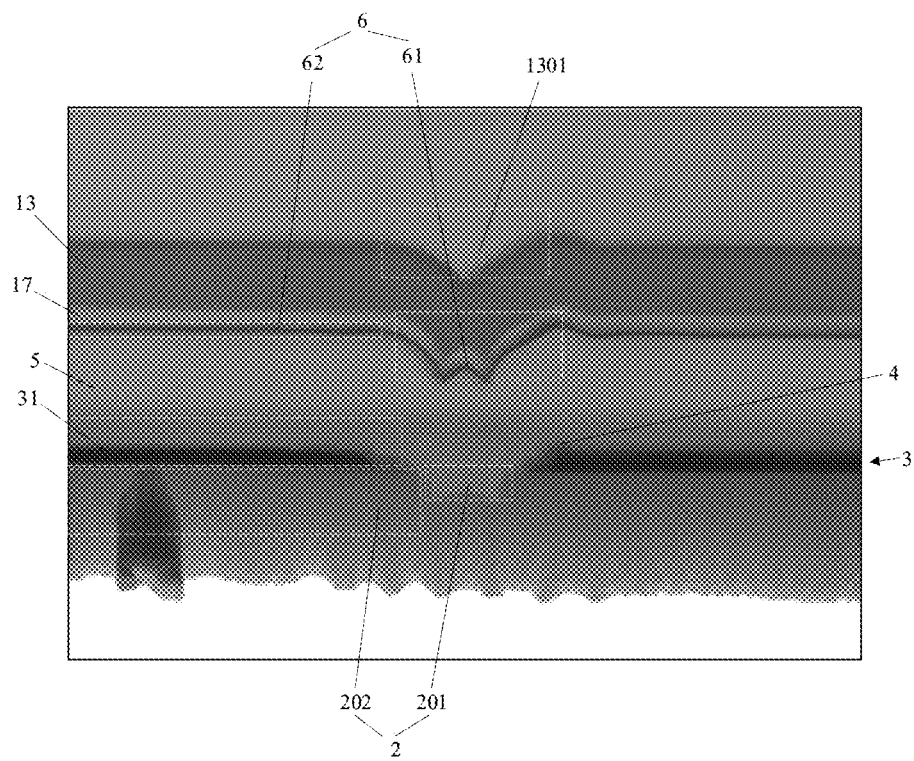
FIG. 2 is a partial electron micrograph of an embodiment of the first type display panel of the present disclosure.

As shown in FIG. 1 and FIG. 2, the display panel may include a substrate 1, a planarization layer 2, a first electrode layer 3, a pixel definition layer 4, a light-emitting functional layer 5 and a second electrode 6.

The planarization layer 2 is arranged at a side of the substrate 1, and the surface of the planarization layer 2 away from the substrate 1 is provided with a plurality of partitioning slots 201, to form a plurality of driving areas 202 on the planarization layer 2, and the plurality of driving areas 202 are distributed in an array.

The first electrode layer 3 is disposed on a surface of the planarization layer 2 away from the substrate 1, and includes a plurality of first electrodes 31 in an array. Orthographic projections of the first electrodes 31 on the planarization layer 2 are located within the driving areas 202 in one-to-one correspondence. Each of the first electrodes 31 includes a planar center portion 310 and an edge portion 311 surrounding the center portion 310; the edge portion 311 includes a planarization portion 3110 surrounding the center portion 310 and a slope portion 3111 connected between the center portion 310 and the planarization portion 3110. A thickness of the planarization portion 3110 is smaller than a thickness of the center portion 310.

The pixel definition layer 4 is disposed on a surface of the planarization layer 2 away from the substrate 1, and exposes at least part of an area of the center portion 310.

The light-emitting functional layer 5 covers the pixel definition layer 4 as well as the center portion 310 exposed by the pixel definition layer 4 and the planarization layer 2.

A second electrode 6 covers the light-emitting functional layer 5.

According to the display panel according to the embodiment of the present disclosure, an area of the center portion 310 of each first electrode 31 exposed by the pixel definition layer 4 and a light-emitting functional layer 5 and a second electrode 6 corresponding thereto constitute a light-emitting device to emit light.

Since the orthographic projections of the first electrodes 31 on the planarization layer 2 are located within the driving areas 202 in one-to-one correspondence, the partitioning slot 201 is located outside the first electrodes 31. When the light-emitting functional layer 5 is formed, the light-emitting functional layer 5 may be recessed toward the substrate 1 at a position of the partitioning slot 201, and the second electrode 6 thereby forms a recessed portion 61 at the recess, and the orthographic projection of the recessed portion 61 on the planarization layer 2 is at least partially located outside the center portion 310 of the first electrode 31, that is, outside the light-emitting device. Therefore, the position of the recessed portion 61 of the second electrode 6 is restricted by the partitioning slot 201, to prevent a sharp discharge or even a short circuit between the recessed portion 61 and the center portion 310, and advantageously ensure that the light-emitting device emits light stably, meanwhile light emission within the recessed portion 61 can be reduced or even avoided, thereby reducing the mutual interference in light emission between the adjacent ones of the light-emitting devices.

As shown in FIG. 2, it is a partial electron micrograph of an embodiment of the first type display panel of the present disclosure, it can be seen that the orthographic projection of the recessed portion 61 on the planarization layer 2 is at least partially located outside a range of the first electrode 31, to reduce the risk of tip discharge between the first electrode 31 and the recessed portion 61, and also reduce and even avoid the light emission of the recessed portion 61 so as to prevent interference from generating between the adjacent ones of the sub-pixels.

Various parts of the first type display panel according to the embodiment of the present disclosure will be described in detail below.

As shown in FIG. 1, a material of the substrate 1 may be a semiconductor material such as monocrystalline silicon or polycrystalline silicon, or other hard or soft materials such as glasses.

In some embodiments of the present disclosure, the substrate 1 may be provided with a plurality of driving transistors for driving each of light-emitting devices to emit light and display images. As an example of a driving transistor with a top gate structure, the display panel further includes a gate insulating layer 7, a gate electrode 8, a first insulating layer 9 and a first wiring layer 10, wherein a material of the substrate 1 may be a semiconductor material such as monocrystalline silicon or polycrystalline silicon, and the substrate 1 includes an active area 101 as well as a source electrode 1011 and a drain electrode 1012 located at both ends of the active area 101. The gate insulating layer 7 covers the active area 101. The gate electrode 8 is disposed on a surface of the gate insulating layer 7 away from the substrate 1, and a material of the gate electrode 8 may include a polysilicon material. The first insulating layer 9 covers the gate electrode 8 and the substrate 1, and a material thereof may include at least one of silicon oxide and silicon nitride. The first wiring layer 10 is disposed on a surface of the first insulating layer 9 away from the substrate 1. The gate electrode 8, the source electrode 1011, and the drain electrode 1012 are all connected to the first wiring layer 10 through via holes filled with tungsten or other metals.

In addition, the display panel may further include a second insulating layer 11 that covers the first wiring layer 10 and the first insulating layer 9, and a second wiring layer 12 that is disposed on a surface of the second insulating layer 11 away from the substrate 1. A specific pattern of the second wiring layer 12 is not particularly limited herein, and may be connected with the first wiring layer 10 through via holes filled with tungsten or other metals.

As shown in FIG. 1, the planarization layer 2 is disposed on a side of the substrate 1. In some embodiments of the present disclosure, the planarization layer 2 may cover the second wiring layer 12. The first electrodes 31 may be connected to the second wiring layers 12 through via holes filled with tungsten or other metals. A material of the planarization layer 2 may include at least one of silicon nitride and silicon oxide, of course, may also include other insulating materials. For example, the planarization layer 2 can realize planarization by a polishing process.

Also shown in FIG. 1, the surface of the planarization layer 2 away from the substrate 1 may be provided with a plurality of partitioning slots 201. The depth H of the partitioning slot 201 is smaller than the thickness P of the planarization layer 2, that is, the partitioning slot 201 does not penetrate through the planarization layer 2 in the depth direction. A plurality of driving areas 202 may be partitioned on the planarization layer 2 by the partitioning slots 201 and are distributed in an array.

The shape of the orthographic projection of driving area 202 on substrate 1 may be rectangular, pentagonal, hexagonal, or other polygons, of course, may also be circular or other shapes, which is not particularly limited thereto. Meanwhile, different driving areas 202 have different shapes and sizes.

In some embodiments of the present disclosure, for example, the partitioning slot 201 may include a first partitioning slot and a second partitioning slot, wherein the number of the first partitioning slot is plural, and the first partitioning slots extend linearly in a first direction and are spaced apart from one another in a second direction; the number of the second partitioning slot is plural, and the second partitioning slots extend linearly in a second direction and are spaced apart from one another in a first direction; and the first direction and the second direction are mutually intersecting directions, for example, the first direction and the second direction are perpendicular to each other. Therefore, a plurality of driving areas 202 distributed in an array may be divided on the planarization layer 2 through the first partitioning slots and the second partitioning slots which are staggered.

In other embodiments of the present disclosure, the first partitioning slots and the second partitioning slots may also extend along a curve or a polyline trajectory, so as to divide driving areas 202 in other shapes.

Each partitioning slot 201 may include two side walls 2011 opposite to one another and a bottom wall 2012 connected between the two side walls 2011. The two side walls 2011 can be arranged in parallel, that is, in a direction perpendicular to substrate 1, and the two side walls 2011 and their extending surfaces do not intersect. Or, the two side walls 2011 may be arranged at a certain included angle.

Figure 3:
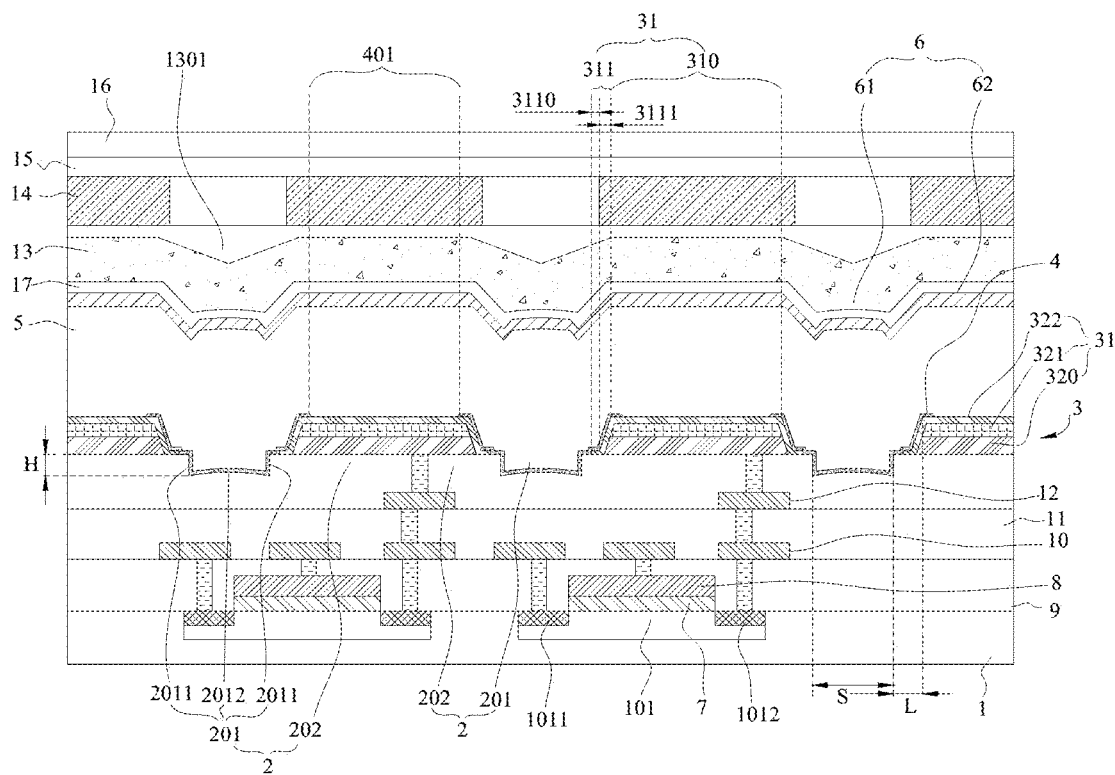
FIG. 3 is a schematic view of another embodiment of a first type display panel of the present disclosure.

As shown in FIG. 3, the bottom wall 2012 may be approximately parallel to the surface of the planarization layer 2 away from the substrate 1, or as shown in FIG. 1, the bottom wall 2012 may also be a curved surface protruded in the direction away from the substrate 1, and a curvature and a shape of the curved surface are not particularly limited herein. In the section perpendicular to the substrate 1, an outline of the bottom wall 2012 may be roughly arc-shaped, parabola-shaped, or wavy-shaped, of course, may also be other regular or irregular shapes as long as it protrudes away from the substrate 1.

In some embodiments of the present disclosure, the two side walls 2011 contract toward the bottom wall 2012, that is, a distance between the two side walls 2011 gradually decreases toward a direction close to the bottom wall 2012, such that the side walls 2011 have slopes relative to the surface of the planarization layer 2 away from the substrate 1. The slopes are included angle α between the side walls 2011 and the surface of the planarization layer 2 away from the substrate 1. Furthermore, the slopes are not less than 700 and not more than 90°, for example, the slopes may be 70°, 80°, and 90°.

In some embodiments of the present disclosure, a maximum distance S between the two side walls 2011 of the partitioning slot 201 may be 0.2 µm-0.7 µm, such as 0.2 µm, 0.3 µm, 0.5 µm or 0.7 µm.

As shown in FIG. 1, the first electrode layer 3 is disposed on the surface of the planarization layer 2 away from the substrate 1 and includes a plurality of first electrodes 31 distributed in an array. The orthographic projections of the first electrodes 31 on the planarization layer 2 are located within the driving areas 202 in one-to-one correspondence, that is, boundaries of the orthographic projections of the first electrodes 31 on the substrate 1 are located within boundaries of the orthographic projections of the driving areas 202 on the substrate 1 in one-to-one correspondence. Only one first electrode 31 is disposed on each of the driving areas 202. Since the driving areas 202 are separated by the partitioning slots 201 and the first electrodes 31 are located in the driving areas 202, the partitioning slots 201 are located outside the first electrodes 31. The shape of the orthographic projection of each first electrode 31 on the planarization layer 2 may be the same as the shape of the driving areas 202 where it is located, and the boundary of the first electrode 31 is located within the driving areas 202 where it is located.

In a direction parallel to the substrate 1, at least one of the first electrodes 31 may include an center portion 310 and an edge portion 311 surrounding the center portion 310, wherein the center portion 310 is a planar structure, that is, the center portion 310 is approximately parallel to the surface of the planarization layer 2 away from the substrate 1.

In some embodiments of the present disclosure, a boundary of the orthographic projection of the center portion 310 of each first electrode 31 on the substrate 1 may be located within a boundary of the orthographic projection of the driving areas 202 where it is located on the substrate 1, that is, a distance L between the boundary of the orthographic projection of the center portion 310 on the substrate 1 and the boundary of the orthographic projection of the driving areas 202 on the substrate 1 is not equal to 0. Furthermore, the distance L is not less than 0.15 μm, for example, the distance may be 0.15 μm, 0.2 μm, and 0.25 μm etc.

The edge portion 311 may include a planarization portion 3110 and a slope portion 3111, wherein the planarization portion 3110 is located on the surface of the planarization layer 2 away from the substrate 1, and is arranged around the center portion 310; and the planarization portion 3110 is approximately parallel to the surface of the planarization layer 2 away from the substrate 1. And the thickness of the planarization portion 3110 is smaller than the thickness of the center portion 310. In some embodiments of the present disclosure, a distance L between the boundary of the orthographic projection of the planarization portion 3110 on the substrate 1 and the boundary of the orthographic projection of the driving areas 202 where it is located on the substrate 1 is not equal to 0. Of course, the boundary of the orthographic projection of the planarization portion 3110 on the substrate 1 overlaps the boundary of the orthographic projection of the driving area 202 on the substrate 1.

A slope portion 3111 is connected between the center portion 310 and the planarization portion 3110, that is, the slope portion 3111 is arranged the center portion 310, and the planarization portion 3110 is arranged around the slope portion 3111. In some embodiments of the present disclosure, a slope of the slope portion 3111 relative to the surface of the planarization layer 2 away from the substrate 1 is not less than 30°, and the slope is an included angle R between the surface of the slope portion 3111 and the surface of the planarization layer 2 away from the substrate 1.

The first electrode 31 includes a first conductive layer 320, a second conductive layer 321 and a third conductive layer 322, wherein the first conductive layer 320 is disposed on the surface of the planarization layer 2 away from the substrate 1; the second conductive layer 321 is disposed on the surface of the first conductive layer 320 away from the substrate 1; a third conductive layer 322 is disposed on the surface of the second conductive layer 321 away from the substrate 1, and extends to the planarization layer 2 at a certain slope, so as to coat the first conductive layer 320 and the second conductive layer 321, and protect the first conductive layer 320 and the second conductive layer 321.

The center portion 310 of the first electrode 31 includes an area of the third conductive layer 322 located on the surface of the second conductive layer 321 away from the substrate 1, the first conductive layer 320 and the second conductive layers 321. The edge portion 311 includes an area of the third conductive layer 322 that coats the edges of the first conductive layer 320 and the second conductive layers 321, that is, an area extending toward the planarization layer 2. Exemplarily, a material of the first conductive layer 320 may include titanium (Ti), a material of the second conductive layer 321 includes silver (Ag), and a material of the third conductive layer 322 includes indium tin oxide (ITO), of course, other materials may also be used.

As shown in FIG. 1, the pixel definition layer 4 is an insulating material, and both the pixel definition layer 4 and the first electrode layer 3 are arranged on the surface of the planarization layer 2 away from the substrate 1. Meanwhile, the pixel definition layer 4 exposes at least a part of the area of the center portion 310 of the first electrode 31, and the center portion 310 exposed by the pixel definition layer 4 as well as the corresponding light emitting functional layer 5 and second electrode 6 form a light-emitting device.

In some embodiments of the present disclosure, each first electrode 31 does not completely cover the driving areas 202 where it is located, and the boundary of the orthographic projection of the planarization portion 3110 of the first electrode 31 on the substrate 1 has a certain distance from the boundary of the orthographic projection of the driving area 202 where it is located. The pixel definition layer 4 extends to the side walls 2011 and the bottom wall 2012 of the partitioning slot 201, that is, the pixel definition layer 4 is attached to the driving area 202 uncovered by the first electrode 31 in shape fit, so that the pixel definition layer 4 is recessed in the area corresponding to the partitioning slot 201. The pixel definition layer 4 is disposed with a plurality of openings 401 exposing at least a part of the area of the center portion 310 in one-to-one correspondence, so that the light emitting range of the light-emitting device can be defined by the pixel definition layer 4.

Figure 5:
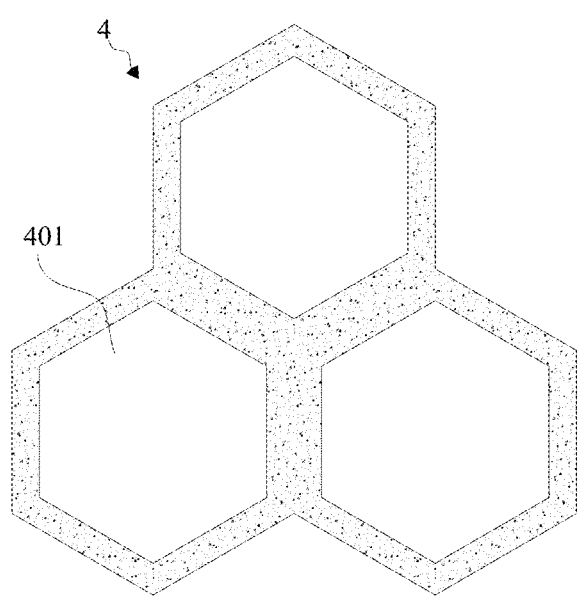
FIG. 5 is a top view of a pixel definition layer in an embodiment of the first type display panel of the present disclosure.
Figure 6:
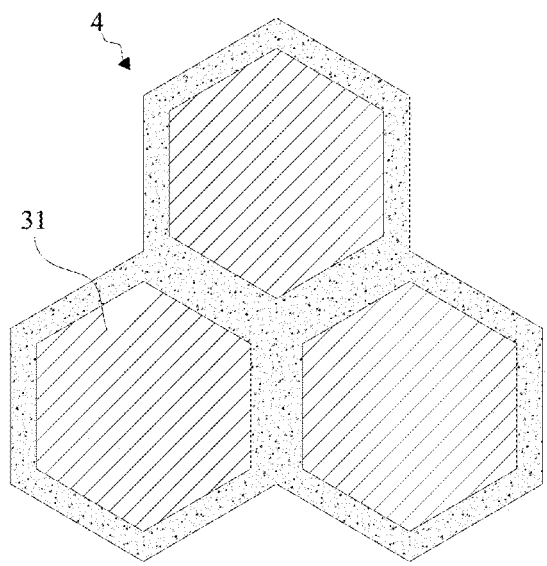
FIG. 6 is a top view of a pixel definition layer and a first electrode in an embodiment of the first type display panel of the present disclosure.

As shown in FIG. 5 and FIG. 6, in some embodiments of the present disclosure, the opening 401 of the pixel definition layer 4 may be hexagonal or other polygonal structure, and the first electrode 31 may also be a polygonal structure and have the same shape as that of the opening 401, of course, the first electrode may also be in other shapes.

As shown in FIG. 1, the light-emitting functional layer 5 may be a continuous film layer, and at least partially covers the center portion 310 of each of the first electrodes 31, that is, covers the area exposed by the opening 401, meanwhile the light-emitting functional layer 5 also covers the pixel definition layer 4 and an area of the planarization layer 2 uncovered by the pixel definition layer 4 and the first electrode 31. When the light-emitting functional layer 5 is formed by evaporation or other processes, the light-emitting functional layer 5 is recessed toward the direction close to the substrate 1 in the area corresponding to the partitioning slot 201.

Figure 4:
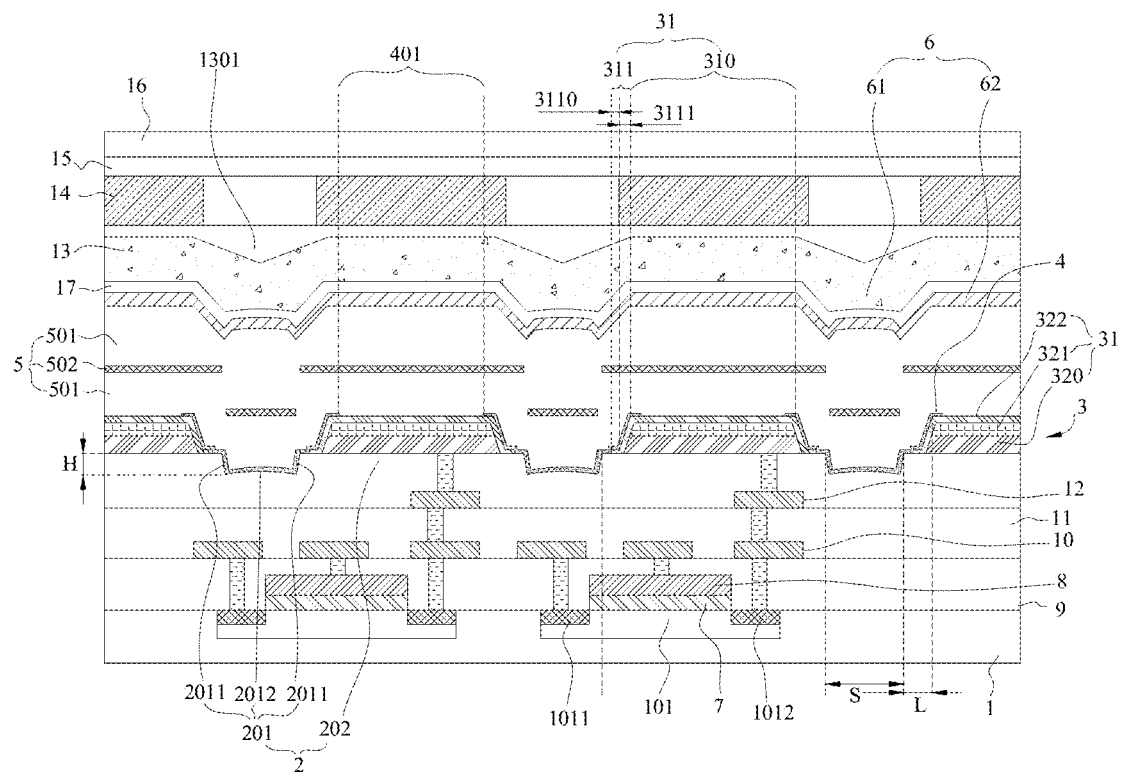
FIG. 4 is a schematic view of a further embodiment of a first type display panel of the present disclosure.

In an embodiment of the present disclosure, as shown in FIG. 4, the light-emitting functional layer 5 includes a plurality of light-emitting unit layers 501. The hole injection layer, the hole transport layer, the light-emitting layer, the electron transport layer, and the electron injection layer of each light-emitting unit layer 501 are distributed in the same way. Meanwhile, a charge generation layer 502 is arranged between two adjacent ones of the light emitting unit layers 501, so that the light emitting unit layers 501 are connected in series through the charge generation layer 502, so as to form a serial-type OLED light-emitting device.

In some other embodiments of the present disclosure, the light-emitting functional layer 5 includes one layer of light-emitting unit layer. The light-emitting unit layer includes a hole injection layer, a hole transport layer, a light-emitting layer, an electron transport layer, and an electron injection layer which are sequentially laminated in a direction away from the substrate 1 from the first electrode 31.

The charge generation layer 502 cannot cover the side walls 2011 of the partitioning slot 201, so that the charge generation layer 502 of the light-emitting device may be cut off by the partitioning slot 201, to avoid crosstalk from generating between the two adjacent ones of the light-emitting devices. Of course, the partitioning slot 201 may also cut off the hole injection layer or other film layers, which can also prevent the crosstalk.

As shown in FIG. 1, the second electrode 6 covers the light-emitting functional layer 5, and driving signals may be applied to the first electrode 31 and the second electrode 6 to allow a portion of the light-emitting functional layer 5 located between the first electrode 31 and the second electrode 6 to emit light.

The appearance of the second electrode 6 is matched with that of the light-emitting functional layer 5, and is recessed in a recess of the light-emitting functional layer 5 to form a recessed portion 61, and form a flat portion 62 in an area corresponding to the center portion 310 of the first electrode 31, such that the orthographic projection of the recessed portion 61 on the planarization layer 2 is at least partially located outside the center portion 310 of the first electrode 31, so as to reduce or avoid tip discharge from generating between the first electrode 31 and the recessed portion 61 of the second electrode 6. A material of the second electrode 6 may be an alloy material, for example, the material of the second electrode 6 may include Mg and Ag; or the second electrode 6 may also adopt an alloy of Al and Li. Of course, the second electrode 6 may also adopt other alloys or single metals, which are not listed herein.

It should be noted that if the pixel definition layer 4 covers the edge of the center portion 310, the flat portion 62 may protrude to a direction away from the substrate 1 in an area corresponding to the pixel definition layer 4 that covers the center portion 310, but a height of the protrusion is less than a thickness of the first center portion 310, so that the flat portion 62 substantially remains flat.

Furthermore, as shown in FIGS. 1 and 2, in some embodiments of the present disclosure, a orthographic projection of the lowest point of the recessed portion 61 of the second electrode 6 on the section perpendicular to the substrate 1 on the planarization layer 2 is completely located inside the partitioning slot 201, that is, completely located outside the center portion 310.

In order to ensure that the partitioning slot 201 enable to cut off the hole injection layer, the charge generation layer 502 or other film layers, the partitioning slot 201 should have a certain depth and should be prevented over deep to penetrate the planarization layer 2, and thus affect the driving device. Therefore, in some embodiments of the present disclosure, in the direction perpendicular to the substrate 1, a maximum depth H of partitioning slot 201 is not less than 30% of a sum of a thickness M of the light-emitting functional layer 5 and a thickness N of the first electrode 31; meanwhile, the maximum depth H of the partitioning slot 201 is not more than 60% of the sum of the thicknesses of the light-emitting functional layer 5 and the first electrode 31. The maximum depth of partitioning slot 201 is a distance between a point having a maximum distance on the bottom wall 2012 of the partitioning slot 201 from the surface of the planarization layer 2 away from the substrate 1 and the surface of the planarization layer 2 away from the substrate 1 in the direction perpendicular to the substrate 1. For example, in some embodiments of the present disclosure, the maximum depth H of the partitioning slot 201 is 1000 Å-3000 Å.

In addition, in some embodiments of the present disclosure, as shown in FIG. 1, the first type display panel may further include a first encapsulation layer 13, a color film layer 14, a second encapsulation layer 15 and a transparent cover plate 16.

The first encapsulation layer 13 may cover the second electrode 6, for example, the first encapsulation layer 13 may include two inorganic layers and an organic layer between the two inorganic layers.

In some embodiments of the present disclosure, the first encapsulation layer 13 may be recessed in an area corresponding to the recessed portion 61 to form a dent 1301. Of course, if the first encapsulation layer 13 has a large thickness, the surface of the first encapsulation layer 13 away from the substrate 1 may also substantially remain flat.

The color film layer 14 is disposed at a side of the first encapsulation layer 13 away from the second electrode 6, and the color film layer 14 includes filter areas corresponding to the first electrodes 31 one by one, and the filter areas have various colors, such as red, blue, and green.

A second encapsulation layer 15 may cover the color film layer 14 which has a structure as same as that of first encapsulation layer 13.

The transparent cover plate 16 may cover the second encapsulation layer 15, and a material thereof may be glass or material.

In addition, in some embodiments of the present disclosure, as shown in FIG. 1, the first type display panel may further include a light extraction layer 17 which covers the surface of the second electrode 6 away from the substrate 1 and is recessed in an area corresponding to the recessed portion 61, and the first encapsulation layer 13 is disposed at a side of the light extraction layer 17 away from the substrate 1. A refractive index of the light extraction layer 17 is greater than that of the second electrode 6, to improve the light-emitting efficiency, and the higher the refractive index, the greater the light-emitting efficiency.

A Second Type Display Panel

Figure 7:
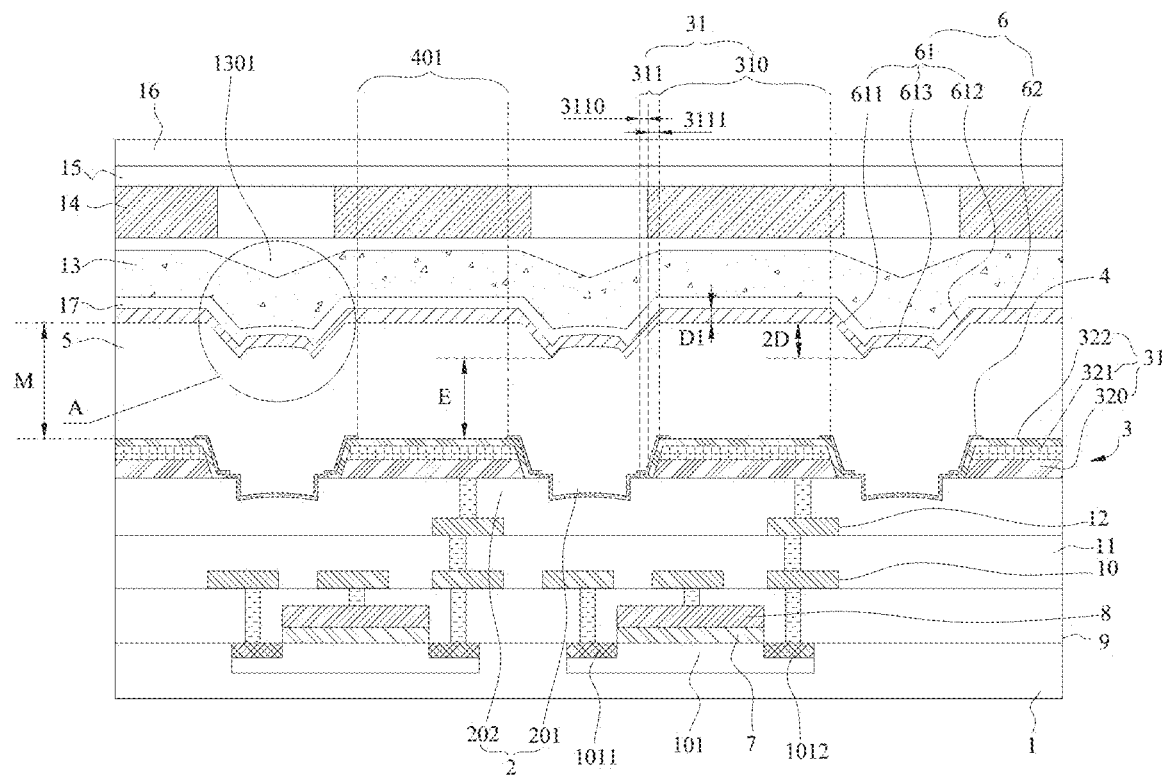
FIG. 7 is a schematic view of an embodiment of a second type display panel of the present disclosure.
Figure 8:
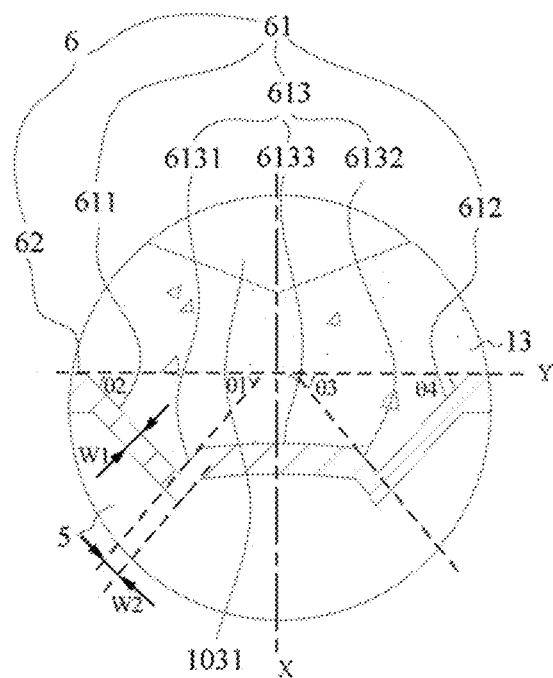
FIG. 8 is an enlarged view of part A in FIG. 7.
Figure 9:
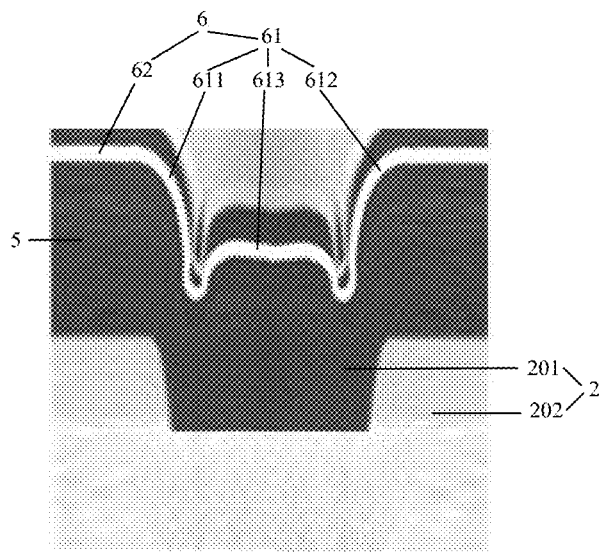
FIG. 9 is a partial electron micrograph of an embodiment of the second type display panel of the present disclosure.

As shown in FIGS. 7 to 9, the second type display panel of the present disclosure may include a substrate 1, a planarization layer 2, a first electrode layer 3, a light-emitting functional layer 5 and a second electrode 6.

The planarization layer 2 is disposed at a side of the substrate 1.

The first electrode layer 3 is disposed on a surface of the planarization layer 2 away from the substrate 1 and includes a plurality of first electrodes 31. The first electrode 31 includes a planar center portion 310 and an edge portion 311 surrounding the center portion 310. The edge portion 311 includes a planarization portion 3110 surrounding the center portion 310 and a slope portion 3111 connected between the center portion 310 and the planarization portion 3110. A thickness of the planarization portion 3110 is smaller than that of the center portion 310.

The light-emitting functional layer 5 covers at least a part of an area of the center portion 310.

The second electrode 6 covers the light-emitting functional layer 5 and includes recessed portions 61 and a plurality of flat portions 62 separated by the recessed portions 61. Orthographic projections of the flat portions 62 on the planarization layer 2 are located within the first electrodes 31 in one-to-one correspondence. The recessed portion 61 is recessed toward a side of the flat portion 62 close to the substrate 1. Orthographic projections of the recessed portions 61 on the planarization layer 2 are at least partially located outside the center portion 310.

In the display panel according to the embodiment of the present disclosure, each first electrode 31 and its corresponding light-emitting functional layer 5 and second electrode 6 may constitute a light-emitting device enable to emit light. The orthographic projection of the recessed portion 61 of the second electrode 6 on the planarization layer 2 is at least partially located outside the center portion 310 with a larger thickness, but is not centrally aligned with the center portion 310, to reduce a risk of tip discharge generated between the recessed portion 61 and the first electrode 31, and facilitate for stable light emission of the light-emitting device, and meanwhile, to reduce the light emission within the recessed portion 61, so as to reduce the mutual interference of the light emission between the adjacent ones of the light-emitting devices.

Various parts of the second type display panel of the present disclosure will be described in detail below.

In some embodiments of the present disclosure, as shown in FIG. 7, the substrate 1 may be provided with a plurality of driving transistors for driving each of light-emitting devices to emit light and display images. As an example of a driving transistor with a top gate structure, the display panel further includes a gate insulating layer 7, a gate electrode 8, a first insulating layer 9 and a first wiring layer 10, wherein a material of the substrate 1 may be a semiconductor material such as monocrystalline silicon or polycrystalline silicon, and the substrate 1 may include an active area 101 as well as a source electrode 1011 and a drain electrode 1012 located at both ends of the active area 101. The gate insulating layer 7 covers the active area 101. The gate electrode 8 is disposed on a surface of the gate insulating layer 7 away from the substrate 1. The first insulating layer 9 covers the gate electrode 8 and the substrate 1, and a material thereof may include at least one of silicon oxide and silicon nitride. The first wiring layer 10 is disposed on a surface of the first insulating layer 9 away from the substrate 1. The gate electrode 8, the source electrode 1011 and the drain electrode 1012 are all connected to the first wiring layer 10 through via holes filled with tungsten or other metals.

In addition, the display panel may further include a second insulating layer 11 that covers the first wiring layer 10 and the first insulating layer 9, and a second wiring layer 12 that is disposed on a surface of the second insulating layer 11 away from the substrate 1. A specific pattern of the second wiring layer 12 is not particularly limited herein, and may be connected with the first wiring layer 10 through via holes filled with tungsten or other metals.

As shown in FIG. 7, the planarization layer 2 is disposed on a side of the substrate 1. In some embodiments of the present disclosure, the planarization layer 2 may cover the second wiring layer 12. The first electrode 31 may be connected to the second wiring layer 12 through via holes filled with tungsten or other metals. A material of the planarization layer 2 may include at least one of silicon nitride and silicon oxide, of course, may also include other insulating materials.

As shown in FIG. 7, the first electrode layer 3 is disposed on the surface of the planarization layer 2 away from the substrate 1, and includes a plurality of first electrodes 31. The first electrodes are distributed in an array, and adjacent ones of the first electrodes 31 are spaced apart.

In a direction parallel to substrate 1, each first electrode 31 may include a center portion 310 and an edge portion 311 surrounding the center portion 310, wherein the center portion 310 is a planar structure, that is, the center portion 310 is approximately parallel to the surface of the planarization layer 2 away from the substrate 1.

The edge portion 311 may include a planarization portion 3110 and a slope portion 3111, wherein the planarization portion 3110 is located on the surface of the planarization layer 2 away from the substrate 1 and is arranged around the center portion 310, and the planarization portion 3110 is approximately parallel to the surface of the planarization layer 2 away from the substrate 1. Meanwhile, a thickness of the planarization portion 3110 is smaller than that of the center portion 310. In some embodiments of the present disclosure, a distance between the planarization portion 3110 and the boundary of the driving areas 202 where it is located is not equal to 0. Of course, the boundary of the planarization portion 3110 may also overlap with the boundary of the driving areas 202.

A slope portion 3111 is connected between the center portion 310 and the planarization portion 3110, that is, the slope portion 3111 is arranged the center portion 310, and the planarization portion 3110 is arranged around the slope portion 3111. In some embodiments of the present disclosure, a slope of the slope portion 3111 relative to the surface of the planarization layer 2 away from the substrate 1 is not less than 30°, and the slope is an included angle between the surface of the slope portion 3111 and the surface of the planarization layer 2 away from the substrate 1.

The first electrode 31 includes a first conductive layer 320, a second conductive layer 321 and a third conductive layer 322, wherein the first conductive layer 320 is disposed on the surface of the planarization layer 2 away from the substrate 1; the second conductive layer 321 is disposed on the surface of the first conductive layer 320 away from the substrate 1; a third conductive layer 322 is disposed on the surface of the second conductive layer 321 away from the substrate 1, and extends to the surface of the driving area 202 where it is located away from the substrate 1 at a certain slope, so as to coat the first conductive layer 320 and the second conductive layer 321, and protect the first conductive layer 320 and the second conductive layer 321.

The center portion 310 of the first electrode 31 includes an area of the third conductive layer 322 located on the surface of the second conductive layer 321 away from the substrate 1, the first conductive layer 320 and the second conductive layers 321. The edge portion 311 includes an area of the third conductive layer 322 that coats the edges of the first conductive layer 320 and the second conductive layers 321, that is, an area extending toward the planarization layer 2. Exemplarily, a material of the first conductive layer 320 may include titanium (Ti), a material of the second conductive layer 321 includes silver (Ag), and a material of the third conductive layer 322 includes indium tin oxide (ITO), of course, other materials may also be used.

As shown in FIG. 7, the light-emitting functional layer 5 may be a continuous film layer and simultaneously cover at least part of the areas of the first electrodes 31. In some embodiments of the present disclosure, the light-emitting functional layer 5 includes a light-emitting unit layer. The light-emitting unit layer includes a hole injection layer, a hole transport layer, a light-emitting layer, an electron transport layer, and an electron injection layer which are sequentially laminated in a direction away from the substrate 1 from the first electrode 31.

In another embodiment of the present disclosure, the light-emitting functional layer 5 includes a plurality of light-emitting unit layers. A hole injection layer, a hole transport layer, a light-emitting layer, an electron transport layer, and an electron injection layer of each light-emitting unit layer are distributed in the same way. Meanwhile, a charge generation layer is arranged between two adjacent ones of the light emitting unit layers, so that the light emitting unit layers are connected in series through the charge generation layer, so as to form a serial-type OLED light-emitting device.

As shown in FIG. 7, the second electrode 6 covers the light-emitting functional layer 5, and driving signals may be applied to the first electrode 31 and the second electrode 6 to allow a portion of the light-emitting functional layer 5 located between the first electrode 31 and the second electrode 6 to emit light. The second electrode 6 includes a plurality of recessed portions 61 and a plurality of flat portions 62.

The flat portions 62 are distributed in an array, and correspond to the center portions 310 of the first electrodes 31 one by one, that is, orthographic projections of the flat portions 62 on the planarization layer 2 are located within the first electrodes 31 in one-to-one correspondence. The flat portions 62 are parallel or approximately parallel to the center portions 310.

The recessed portions 61 correspond to areas of the planarization layers 2 uncovered by the center portions 310, for partitioning the flat portions 62. The recessed portion 61 is recessed toward a side of the flat portion 62 close to the substrate 1. The recessed portion 61 has a ring structure, and the number of the recessed portion 61 is plural. The recessed portions 61 surround the flat portions 62 in one-to-one correspondence, that is, the recessed portion 61 is a transition area of the two adjacent ones of the flat portions 62.

The orthographic projections of the recessed portions 61 on the substrate 1 are at least partially located outside the center portion 310 of the first electrode 31, to centrally align with an area outside the first electrode 31 or an edge portion 311 with smaller thickness, but not centrally align with the center portion 310 with the larger thickness, so as to reduce a risk of tip discharge and short circuit generated between the recessed portions 61 and the first electrodes 31, thereby improving the light-emitting stability of the light-emitting device.

In some embodiments of the present disclosure, on a section perpendicular to the substrate 1, an orthographic projection of the lowest point of the recessed portion 61 on planar layer 2 is located outside the center portion 310, for example, the lowest point corresponds to one of the slope portion 3111 and the planarization portion 3110 one by one to avoid the tip discharge from generating with the center portion 310. The lowest point of the recessed portion 61 on the section perpendicular to the substrate 1 is a point of the recessed portion 61 closest to the first electrode 31, that is, a point farthest from the flat portion 62 on the section perpendicular to the substrate 1.

It should be noted that the number of sections of the recessed portion 61 perpendicular to the substrate 1 may be plural, and different sections may have different lowest points. For example, the lowest point may be a point closest to the center portion 310 of the first electrode 31 in a depth direction, and also other points in the depth direction, depending on the position of the section perpendicular to the substrate 1.

As shown in FIGS. 7 to 9, in some embodiments of the present disclosure, the recessed portion 61 has two sides, including a first side surface 611, a second side surface 612 and a bottom surface 613, wherein the first side surface 611 and the second side surface 612 are oppositely arranged and connected to both sides of the bottom surface 613. Meanwhile, the first side surface 611 and the second side surface 612 may contract in a direction close to the substrate 1. The first side surface 611 and the second side surface 612 may be curved surface or flat surface, which are not particularly limited herein.

The bottom surface 613 may be a curved surface protruding to a direction away from the substrate 1. In some embodiments of the present disclosure, the bottom surface 613 of the recessed portion 61 includes a first slope surface 6131, a second slope surface 6132 and a connecting surface 6133, wherein the first slope surface 6131 and the second slope surface 6132 may be curved surfaces or flat surfaces; and the connecting surface 6133 is located at a side of bottom ends of the first side surface 611 and the second side surface 612 away from the substrate 1, and is connected between the first slope surface 6131 and the second slope surface 6132. The first slope surface 6131 is connected to the bottom end of the first side surface 611, and the second slope surface 6132 is connected to the bottom end of the second side surface 612.

In some embodiments of the present disclosure, as shown in FIG. 8, Y represents the plane where the center portion 310 is located. The slope θ1 of the first slope surface 6131 relative to the center portion 310 is not less than the slope θ2 of the first side surface 611 relative to the center portion 310. Meanwhile, the slope θ3 of the second slope surface 6132 relative to the center portion 310 is not less than the slope θ4 of the second side surface 612 relative to the center portion 310.

Furthermore, in the section perpendicular to substrate 1, the first slope surface 6131 and the second slope surface 6132 are symmetrical to the connecting surface 6133, that is, the section of the first slope surface 6131 perpendicular to the substrate 1 and the second of the second slope surface 6132 perpendicular to the substrate 1 are symmetrical to the center line X of the section of the connecting surface 6133 perpendicular to the substrate 1. Meanwhile, in the section perpendicular to the substrate 1, as shown in FIG. 8, the first side surface 611 and the second side surface 612 are symmetrical to the bottom surface 613, that is, the section of the first side surface 611 perpendicular to the substrate 1 and the section of the second side surface 612 perpendicular to the substrate 1 are symmetrical to the center line X of the section of the bottom surface 613 perpendicular to the substrate 1.

In some embodiments of the present disclosure, as shown in FIG. 8, a minimum thickness W1 of an area of the second electrode 6 corresponding to the first side surface 611 and the second side surface 612 is greater than a minimum thickness W2 of an area of the second electrode 6 corresponding to the first slope surface 6131 and the second slope surface 6132.

Furthermore, as shown in FIG. 7, in some embodiments of the present disclosure, a depth D2 of the recessed portion 61 is less than twice of the maximum thickness D1 of the second electrode 6, for example, the maximum thickness of the second electrode 6 is 90 nm, and the depth of the recessed portion 61 is less than 180 nm, for example 120 nm, 100 nm, 80 nm, 70 nm, 60 nm, 50 nm, 40 nm, etc. A depth D2 of the recessed portion 61 refers to the maximum depth of the recessed portion 61, that is, a distance between the point of the recessed portion 61 closet to the substrate 1 and the surface of the flat portion 62 away from the substrate 1 in the direction perpendicular to the substrate 1.

In some embodiments of the present disclosure, as shown in FIGS. 7 and 8, the orthographic projection of each recessed portion 61 on the planarization layer 2 surrounds the outside of the center portion 310 of the first electrode 31, and a minimum value of a distance between the bottom surface 613 of the recessed portion 61 and the center portion 310 of the adjacent first electrode 31, that is, a distance between the point of the recessed portion 61 closet to the center portion 310 and the center portion 310 in the direction perpendicular to the substrate 1, is not less than 70% of the total thickness of the flat portion 62 and the light-emitting functional layer 5. The total thickness of the flat portion 62 and the light-emitting functional layer 5 is a sum of the thickness D1 of the flat portion 62 and the thickness M of the light-emitting functional layer 5, for example, the total thickness of the flat portion 62 and the light-emitting functional layer 5 is about 365 nm, and the minimum value of the distance between the bottom of the recessed portion 61 in the direction perpendicular to the substrate 1 and the center portion 310 of the adjacent first electrode 31 is about 255 nm.

Furthermore, the maximum value of the distance E between the bottom of the recessed portion 61 and the center portion 310 of the adjacent first electrode 31 (the distance between the point of the recessed portion 61 nearest to the center portion 310 and the center portion 310 in the direction perpendicular to the substrate 1) is not less than 400 nm, and the maximum value thereof is not more than 450 nm.

As shown in FIG. 7, in order to facilitate the formation of the second electrode 6, in some embodiments of the present disclosure, a plurality of partitioning slots 201 may be formed on the surface of the planarization layer 2 away from the substrate 1. The depth of the partitioning slot 201 is smaller than the thickness of the planarization layer 2, that is, the partitioning slots 201 cannot penetrate through the planarization layer 2 in the depth direction. A plurality of driving areas 202 may be partitioned on the planarization layer 2 by the partitioning slots 201, and the driving areas 202 are distributed in an array. The specific structure of the partitioning slot 201 may refer to the embodiment of the first type display panel described above, and will not be described in detail herein. Meanwhile, the second type display panel of the present disclosure further includes a pixel definition layer 4 which is made of an insulating material. The pixel definition layer 4 and the first electrode layer 3 are arranged on the surface of the planarization layer 2 away from the substrate 1. Meanwhile, the pixel definition layer 4 exposes at least a part of the area of the center portion 310 of the first electrode 31 and is recessed in the area corresponding to the partitioning slot 201. The center portion 310 exposed by the pixel definition layer 4, its corresponding light emitting functional layer 5 and the second electrode 6 may form a light-emitting device. The structure of the pixel definition layer 4 may refer to the embodiment of the first type display panel described above, and will not be described in detail herein.

The light-emitting functional layer 5 also covers the pixel definition layer 4 and an area of the planarization layer 2 uncovered by the pixel definition layer 4 and the first electrode 31. When the light-emitting functional layer 5 is formed by evaporation or other processes, the light-emitting functional layer 5 is recessed in the area corresponding to the partitioning slot 201 toward the direction close to the substrate 1. The orthographic projection of the recessed portion 61 of the second electrode 6 on the planarization layer 2 is at least partially within the partitioning slot 201.

In addition, as shown in FIG. 7, the first type display panel of the present disclosure may further include a first encapsulation layer 13. The first encapsulation layer 13 may cover the second electrode 6, for example, the first encapsulation layer 13 may include two inorganic layers and an organic layer between the two inorganic layers. The first encapsulation layer 13 forms a dent 1301 in an area corresponding to the recessed portion 61, and the two side walls of the dent 1301 are narrowed toward the direction close to the substrate 1, and the two side walls are connected.

In addition, the display panel may further include a color film layer 14, a second encapsulation layer 15 and a transparent cover plate 16.

The color film layer 14 is disposed at a side of the first encapsulation layer 13 away from the second electrode 6, and the color film layer 14 includes filter areas corresponding to the first electrodes 31 one by one, and the filter areas have various colors, such as red, blue, and green.

A second encapsulation layer 15 may cover the color film layer 14 which has a structure as same as that of first encapsulation layer 13.

The transparent cover plate 16 may cover the second encapsulation layer 15, and a material thereof may be glass or material.

In addition, in some embodiments of the present disclosure, as shown in FIG. 7, the second type display panel may further include a light extraction layer 17 which covers the surface of the second electrode 6 away from the substrate 1 and is recessed in an area corresponding to the recessed portion 61, and the first encapsulation layer 13 is disposed at a side of the light extraction layer 17 away from the substrate 1. A refractive index of the light extraction layer 17 is greater than that of the second electrode 6, to improve the light-emitting efficiency, and the higher the refractive index, the greater the light-emitting efficiency.

Figure 10:
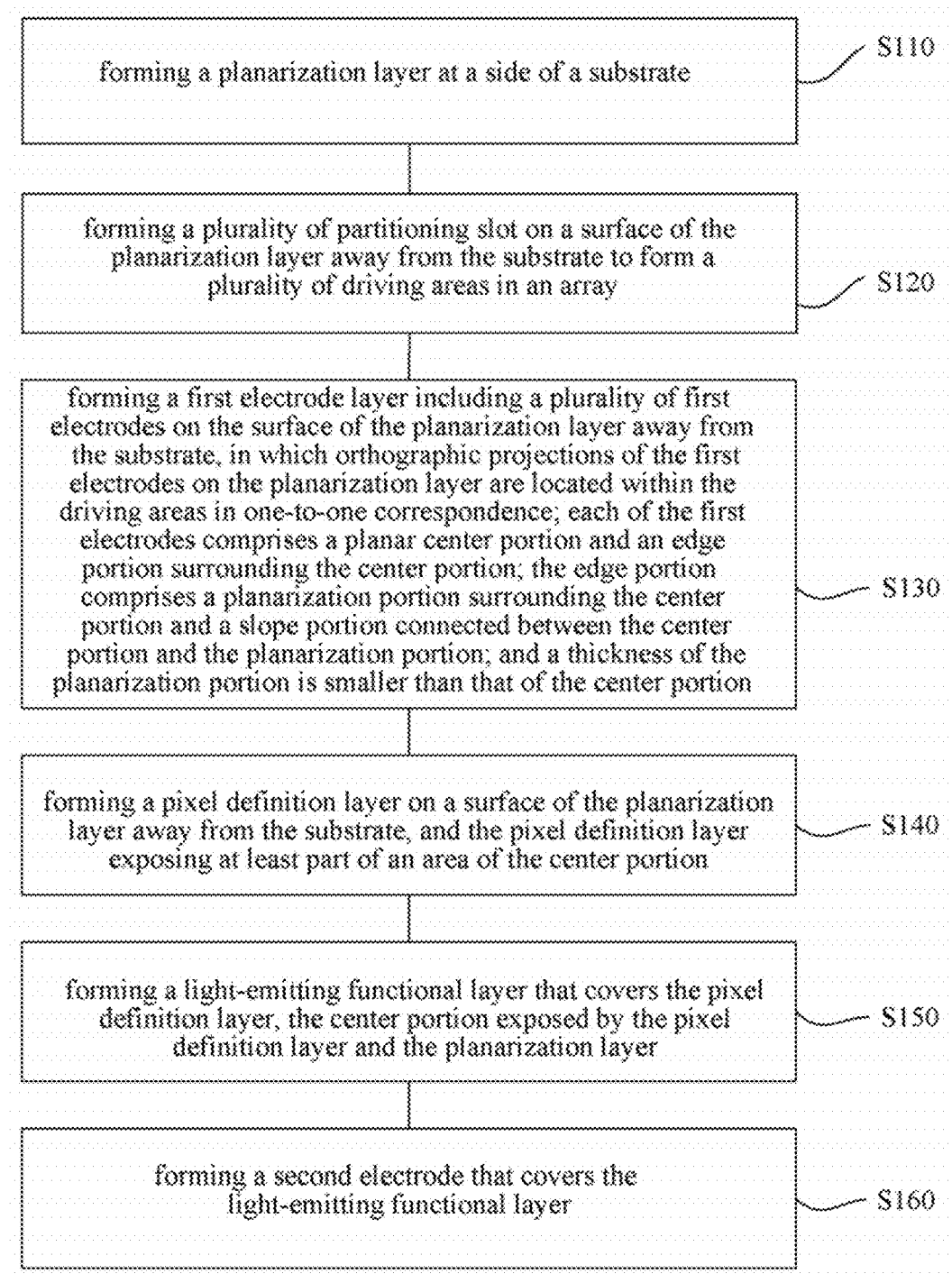
FIG. 10 is a schematic view of an embodiment of a manufacturing method of a first type display panel of the present disclosure.

An embodiment of the present disclosure also provides a manufacturing method of a display panel, which may be the first type display panel described above, as shown in FIG. 10, and the manufacturing method includes steps S110-S160, wherein:

S110, forming a planarization layer at a side of a substrate;

S120, forming a plurality of partitioning slot on a surface of the planarization layer away from the substrate to form a plurality of driving areas in an array;

S130, forming a first electrode layer including a plurality of first electrodes on the surface of the planarization layer away from the substrate, in which orthographic projections of the first electrodes on the planarization layer are located within the driving areas in one-to-one correspondence; each of the first electrodes comprises a planar center portion and an edge portion surrounding the center portion; the edge portion comprises a planarization portion surrounding the center portion and a slope portion connected between the center portion and the planarization portion; and a thickness of the planarization portion is smaller than that of the center portion;

S140, forming a pixel definition layer on a surface of the planarization layer away from the substrate, and the pixel definition layer exposing at least part of an area of the center portion;

S150, forming a light-emitting functional layer that covers the pixel definition layer, the center portion exposed by the pixel definition layer and the planarization layer;

S160, forming a second electrode that covers the light-emitting functional layer.

The details and beneficial effects of the structures on each layer of the manufacturing method of the embodiment of the present disclosure have been described in the embodiment of the first type display panel mentioned above, and will not be repeated herein.

Figure 11:
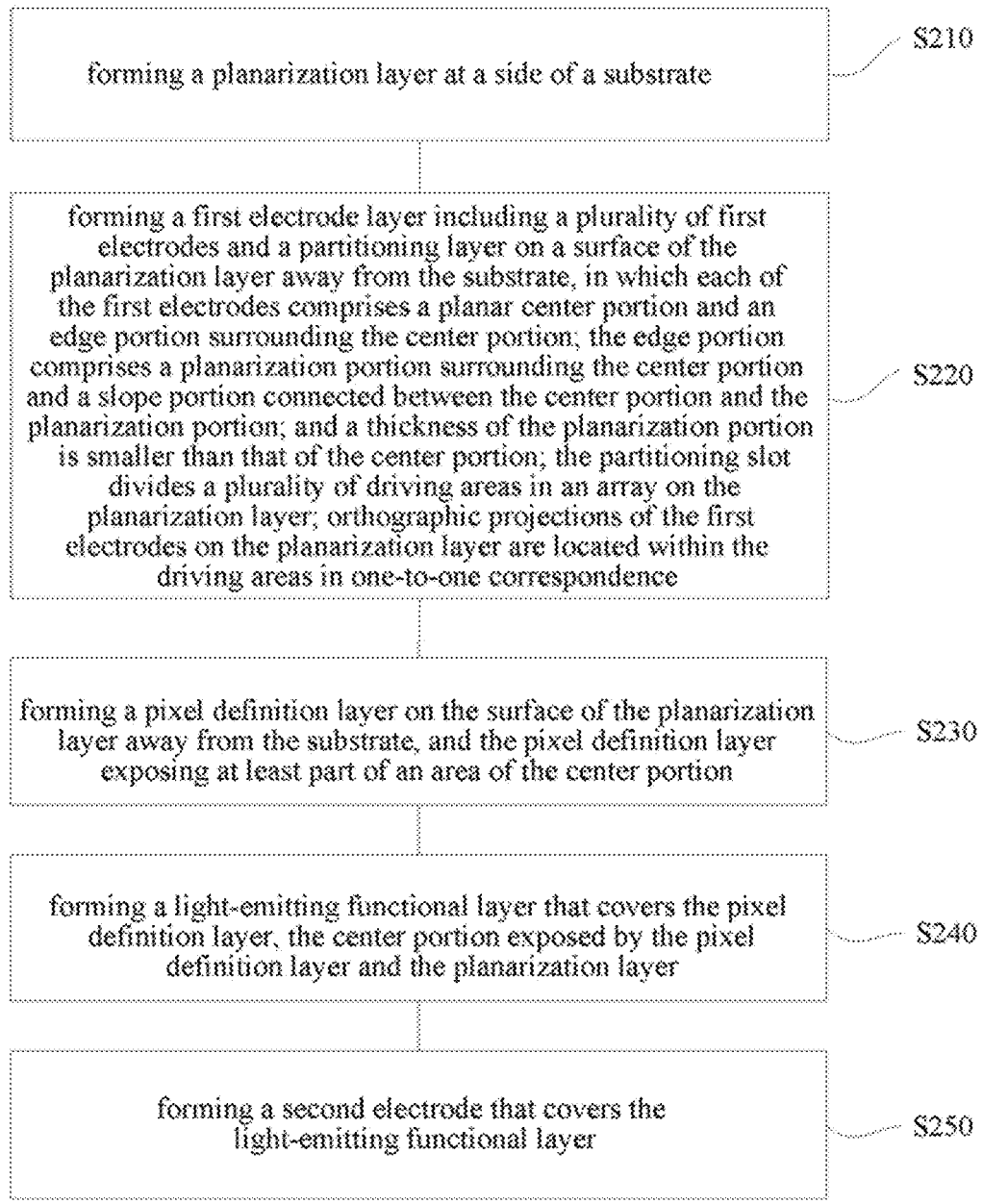
FIG. 11 is a schematic view of another embodiment of a manufacturing method of a first type display panel of the present disclosure.

An embodiment of the present disclosure also provides a manufacturing method of a display panel, which may be the first type display panel described above, as shown in FIG. 11, and the manufacturing method includes steps S210-S250, wherein:

S210, forming a planarization layer at a side of a substrate;

S220, forming a first electrode layer including a plurality of first electrodes and a partitioning layer on a surface of the planarization layer away from the substrate, in which each of the first electrodes comprises a planar center portion and an edge portion surrounding the center portion; the edge portion comprises a planarization portion surrounding the center portion and a slope portion connected between the center portion and the planarization portion; and a thickness of the planarization portion is smaller than that of the center portion; the partitioning slot divides a plurality of driving areas in an array on the planarization layer; orthographic projections of the first electrodes on the planarization layer are located within the driving areas in one-to-one correspondence;

S230, forming a pixel definition layer on the surface of the planarization layer away from the substrate, and the pixel definition layer exposing at least part of an area of the center portion;

S240, forming a light-emitting functional layer that covers the pixel definition layer, the center portion exposed by the pixel definition layer and the planarization layer;

S250, forming a second electrode that covers the light-emitting functional layer.

In the manufacturing method of this embodiment, a conductive layer may be formed on the surface of the planarization layer away from the substrate, and the conductive layer is patterned through one gray-scale mask process to obtain a first electrode layer, meanwhile, a partitioning slot may be formed through the one gray-scale mask process. Compared with the method of forming the first electrode layer and the partitioning slot respectively through two mask processes, the manufacturing process of the display panel can be simplified.

Figure 12:
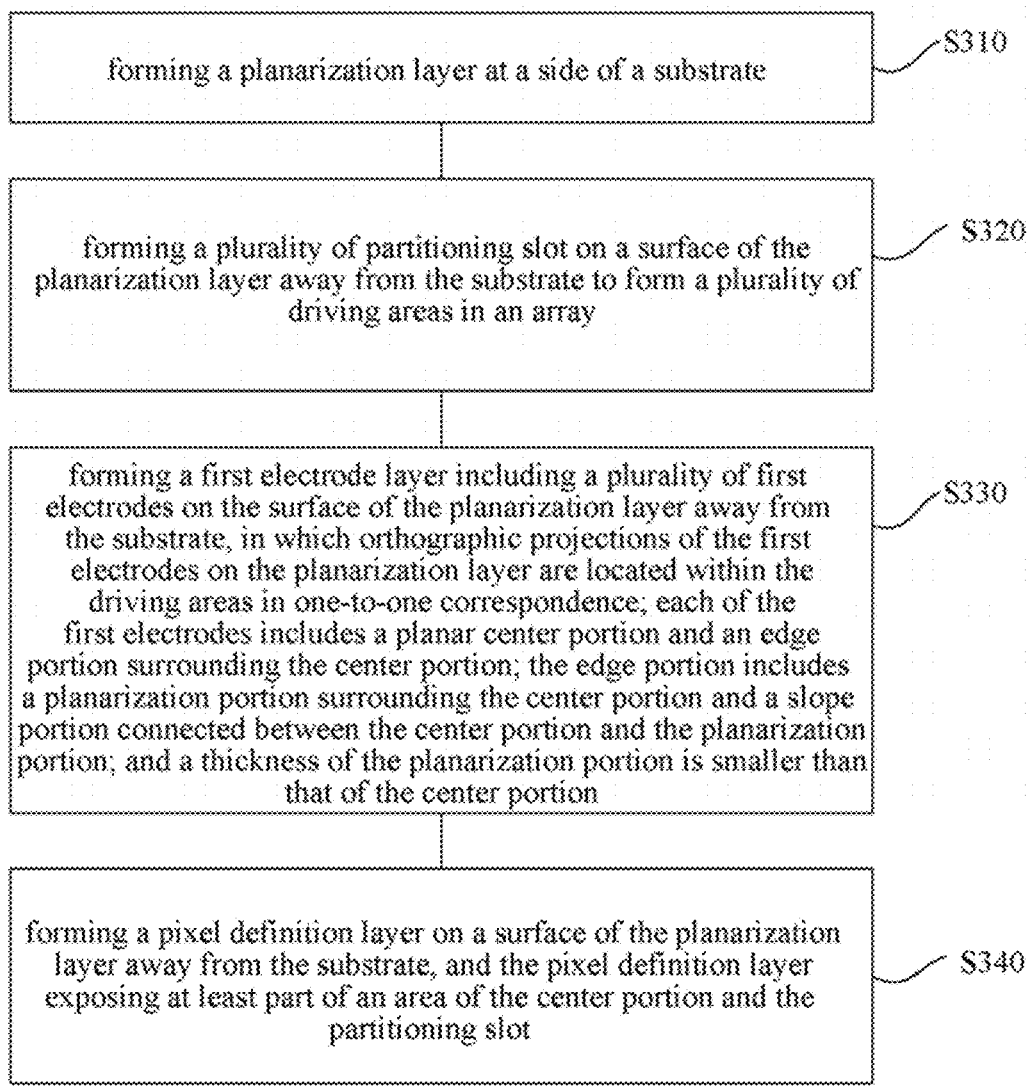
FIG. 12 is a schematic view of an embodiment of a manufacturing method of a second type display panel of the present disclosure.

An embodiment of the present disclosure also provides a manufacturing method of a display panel, which may be the second type display panel described above, as shown in FIG. 12, and the manufacturing method includes steps S310-S340, wherein S310, forming a planarization layer at a side of a substrate;

S320, forming a plurality of partitioning slot on a surface of the planarization layer away from the substrate to form a plurality of driving areas in an array;

S330, forming a first electrode layer including a plurality of first electrodes on the surface of the planarization layer away from the substrate, in which orthographic projections of the first electrodes on the planarization layer are located within the driving areas in one-to-one correspondence; each of the first electrodes includes a planar center portion and an edge portion surrounding the center portion; the edge portion includes a planarization portion surrounding the center portion and a slope portion connected between the center portion and the planarization portion; and a thickness of the planarization portion is smaller than that of the center portion;

S340, forming a pixel definition layer on a surface of the planarization layer away from the substrate, and the pixel definition layer exposing at least part of an area of the center portion and the partitioning slot.

The details and beneficial effects of the structures on each layer of the manufacturing method of the embodiment of the present disclosure have been described in the embodiment of the second type display panel mentioned above, and will not be repeated herein.

It should be noted that although the various steps of the method of the present disclosure are described in a particular order in the figures, it is not required or implied that the steps must be performed in the particular order, or all the illustrated steps must be performed to achieve the desired result. Additionally or alternatively, some steps may be omitted, or multiple steps may be combined into one step to be performed, and/or one step is decomposed into multiple steps to be performed.

The embodiments of the present disclosure also provide a display device, which may include any one of the first type display panel and the second type display panel in the above embodiments, and the specific structure may refer to the above embodiments, which will not be repeated herein. The display device of this disclosure may be used for electronic equipment such as mobile phones, tablet computers, televisions, and the like.

Other embodiments of the present disclosure will be apparent to those skilled in the art from consideration of the specification and practice of the disclosure disclosed herein. This application is intended to cover any variations, uses, or adaptations of the disclosure following the general principles thereof and including such departures from the present disclosure as come within known or customary practice in the art. It is intended that the specification and embodiments be considered as exemplary only, with a true scope and spirit of the present disclosure being indicated by the following claims.

What is claimed is:

1. A display panel, comprising:
a substrate;
a planarization layer at a side of the substrate, and a surface of the planarization layer away from the substrate being provided with a plurality of partitioning slots to form a plurality of driving areas in an array;
a first electrode layer on the surface of the planarization layer away from the substrate, and comprising a plurality of first electrodes; orthographic projections of the first electrodes on the planarization layer within the driving areas in one-to-one correspondence; each of the first electrodes comprising a planar center portion and an edge portion surrounding the center portion; the edge portion comprising a planarization portion surrounding the center portion and a slope portion connected between the center portion and the planarization portion; and a thickness of the planarization portion being smaller than a thickness of the center portion;
a pixel definition layer on the surface of the planarization layer away from the substrate, and exposing at least part of the center portion;
a light-emitting functional layer covering the pixel definition layer, the center portion exposed by the pixel definition layer and the planarization layer; and
a second electrode covering the light-emitting functional layer.

2. The display panel according to claim 1, wherein a maximum depth of the partitioning slot is not less than 30% of a sum of thicknesses of the light-emitting functional layer and the first electrodes.

3. The display panel according to claim 1, wherein a maximum depth of the partitioning slot is not less than 60% of a sum of thicknesses of the light-emitting functional layer and the first electrodes.

4. The display panel according to claim 2, wherein the maximum depth of the partitioning slot is 1000 Å-3000 Å.

5. The display panel according to claim 1, wherein the partitioning slot comprises two side walls opposite to each other and a bottom surface connected between said two side walls, and a maximum distance between said two side walls is 0.2 μm-0.7 μm.

6. The display panel according to claim 1, wherein the partitioning slot comprises two side walls opposite to each other and a bottom surface connected between said two side walls, and the bottom surface is a curved surface projected to a direction away from the substrate.

7. The display panel according to claim 1, wherein the partitioning slot comprises two side walls opposite to each other and a bottom surface connected between said two side walls, and said two side walls are in parallel with each other.

8. The display panel according to claim 1, wherein the partitioning slot comprises two side walls opposite to each other and a bottom surface connected between said two side walls; and a distance between said two side walls decreases along a direction close to the bottom surface.

9. The display panel according to claim 8, wherein slopes of said two side walls are not less than 70°, and the slopes are included angles between the side walls and the surface of the planarization layer away from the substrate.

10. The display panel according to claim 1, wherein a distance between a boundary of an orthographic projection of the center portion on the substrate and a boundary of a projection of a driving area where the center portion positions on the substrate is not less than 0.15 μm.

11. The display panel according to claim 1, wherein a distance between a boundary of an orthographic projection of the planarization portion on the substrate and a boundary of an orthographic projection of the driving area where the planarization portion positions on the substrate is not less than 0.

12. The display panel according to claim 11, wherein the pixel definition layer extends into the partitioning slot and is recessed in an area corresponding to the partitioning slot.

13. A display panel, comprising:
a substrate;
a planarization layer at a side of the substrate;
a first electrode layer on a surface of the planarization layer away from the substrate and comprising a plurality of first electrodes; each of the first electrodes comprising a planar center portion and an edge portion surrounding the center portion; the edge portion comprising a planarization portion surrounding the center portion and a slope portion connected between the center portion and the planarization portion, and a thickness of the planarization portion being smaller than that of the center portion;
a light-emitting functional layer covering at least part of the center portion; and
a second electrode covering the light-emitting functional layer and comprising a recessed portion and a plurality of flat portions separated by the recessed portion;
wherein orthographic projections of the flat portions on the planarization layer within the first electrodes are in one-to-one correspondence;
wherein the recessed portions are recessed toward a side of the flat portions close to the substrate; and
wherein an orthographic projection of the recessed portion on the planarization layer is at least partially outside the center portion.

14. The display panel according to claim 13, wherein on a section perpendicular to the substrate, an orthographic projection of a lowest point of the recessed portion on the planarization layer is outside the center portion.

15. The display panel according to claim 13, wherein the recessed portion comprises a first side surface, a second side surface and a bottom surface; the first side surface and the second side surface are connected to two sides of the bottom surface, and the first side surface and the second side surface contract along a direction close to the substrate.

16. The display panel according to claim 15, wherein the bottom surface of the recessed portion comprises a first slope surface, a second slope surface and a connecting surface connected between the first slope surface and the second slope surface; the connecting surface is located at a side of bottom ends of the first side surface and the second side surface away from the substrate; and the first slope surface is connected to the bottom end of the first side surface, and the second slope surface is connected to the bottom end of the second side surface.

17. The display panel according to claim 16, wherein:
a slope of the first slope surface relative to the center portion is not smaller than a slope of the first side surface relative to the center portion; and
a slope of the second slope surface relative to the center portion is not smaller than a slope of the second side surface relative to the center portion.

18. The display panel according to claim 16, wherein in a section perpendicular to the substrate, the first slope surface and the second slope surface are symmetrical relative to the connecting surface, and the first side surface and the second side surface are symmetrical relative to the bottom surface.

19. The display panel according to claim 16, wherein minimum thicknesses of areas of the second electrode corresponding to the first side surface and the second side surface are greater than minimum thicknesses of areas of the second electrode corresponding to the first slope surface and the second slope surface.

20. The display panel according to claim 1, wherein:
the surface of the planarization layer away from the substrate is disposed with a plurality of partitioning slots to form a plurality of driving areas in an array;
orthographic projections of the first electrodes on the planarization layer are within the first electrodes in one-to-one correspondence; and
the display panel further comprises a pixel definition layer on the surface of the planarization layer away from the substrate exposing at least part of the center portion, at least part of an area of the orthographic projection of the recessed portion on the planarization layer being within the partitioning slot.

* * * * *